(12) United States Patent
Zhu

(10) Patent No.: US 11,259,424 B2
(45) Date of Patent: Feb. 22, 2022

(54) DISPLAY DEVICE AND METHOD OF MANUFACTURING SAME

(71) Applicant: WUHAN CHINA STAR OPTOELECTRONICS SEMICONDUCTOR DISPLAY TECHNOLOGY CO., LTD., Hubei (CN)

(72) Inventor: Cuilin Zhu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 374 days.

(21) Appl. No.: 16/473,193

(22) PCT Filed: Jan. 14, 2019

(86) PCT No.: PCT/CN2019/071538
§ 371 (c)(1),
(2) Date: Jun. 24, 2019

(87) PCT Pub. No.: WO2020/124712
PCT Pub. Date: Jun. 25, 2020

(65) Prior Publication Data
US 2021/0337682 A1    Oct. 28, 2021

(30) Foreign Application Priority Data

Dec. 19, 2018 (CN) .......................... 201811559370.3

(51) Int. Cl.
*H05K 7/02* (2006.01)
*H05K 7/04* (2006.01)
(Continued)

(52) U.S. Cl.
CPC ......... *H05K 5/0217* (2013.01); *H05K 5/0017* (2013.01)

(58) Field of Classification Search
USPC ....................................................... 361/807
See application file for complete search history.

(56) References Cited

U.S. PATENT DOCUMENTS

2013/0169515 A1* 7/2013 Prushinskiy .......... G06F 1/1652
345/55
2014/0217382 A1 8/2014 Kwon et al.
(Continued)

FOREIGN PATENT DOCUMENTS

CN    105009188 A    10/2015
CN    108010448 A    5/2018
(Continued)

*Primary Examiner* — Hung S. Bui

(57) ABSTRACT

A display device and a method of manufacturing the same are provided. The display device includes a backplate, a display panel, and a supporting structure. The backplate includes a first backplate and a second backplate. The display panel includes a first non-bending area, a second non-bending area, and a bending area. The first backplate is configured to support the first non-bending area. The second backplate is configured to support the second non-bending area. The bending area is bent toward the backplate to form a bending space. The supporting structure is filled in the bending space to support the bending area of the display panel.

11 Claims, 9 Drawing Sheets

(51) Int. Cl.
*H05K 5/02* (2006.01)
*H05K 5/00* (2006.01)

(56) References Cited

U.S. PATENT DOCUMENTS

| | | | |
|---|---|---|---|
| 2016/0293869 A1* | 10/2016 | Saeki | H01L 27/3276 |
| 2017/0042047 A1* | 2/2017 | Oh | G09G 3/20 |
| 2018/0034002 A1* | 2/2018 | Kim | H01L 51/5253 |
| 2018/0081399 A1* | 3/2018 | Kwon | H01L 51/0097 |
| 2018/0180911 A1* | 6/2018 | Odaka | H01L 51/0097 |
| 2019/0259310 A1* | 8/2019 | Ha | G09F 9/301 |

FOREIGN PATENT DOCUMENTS

| | | |
|---|---|---|
| CN | 108281387 A | 7/2018 |
| CN | 108597380 A | 9/2018 |

* cited by examiner

DISPLAY DEVICE AND METHOD OF MANUFACTURING SAME

FIELD OF INVENTION

The present disclosure relates to display technologies, and more particularly, to a display device and a method of manufacturing the same.

BACKGROUND OF INVENTION

With continuous development of display technology, a narrow frame has become a development focus because a flexible display device has a bending characteristic to realize the narrow frame.

Referring to FIG. 1, a flexible display device 1 includes a first backplate 11, a second backplate 12, and a display panel 13. The first backplate 11 and the second backplate 12 are configured to support a non-bending area 131 of the display panel 13. A bending area 132 of the display panel 13 is easy to collapse and damage a circuit thereon when the bending area 132 is bent without a supporting structure.

Therefore, there is a need for a display device and a method of manufacturing the same to solve the above problems.

SUMMARY OF INVENTION

In view of the above, the present disclosure provides display device and a method of manufacturing the same to resolve above-mentioned technical problem. The present disclosure improves product yield.

In order to achieve above-mentioned object of the present disclosure, one embodiment of the disclosure provides a display device including a backplate, a display panel, and a supporting structure. The backplate includes a first backplate and a second backplate. The display panel includes a first non-bending area, a second non-bending area, and a bending area disposed between the first non-bending area and the second non-bending area.

The first backplate is configured to support the first non-bending area.

The second backplate is configured to support the second non-bending area.

The bending area is bent toward the backplate to form a bending space, and to make the first backplate attach the second backplate.

The supporting structure is filled in the bending space to support the bending area of the display panel.

In one embodiment of the disclosure, materials of the supporting structure include thermosetting glue, rubber or silicone.

In one embodiment of the disclosure, a surface of the supporting structure is an irregular curved surface, when a material of the support structure is a thermosetting glue, and the supporting structure is partially filled the bending space, so that the bending space includes an irregular curved surface matched with the supporting structure.

In one embodiment of the disclosure, the bending space has a semi-cylindrical shape, and the supporting structure has a semi-cylindrical shape matching the bending space.

In one embodiment of the disclosure, a radius of a cross-section of the supporting structure is not less than a radius of a cross-section of the bending space.

In one embodiment of the disclosure, the bending space has a semi-cylindrical shape, the supporting structure includes a semi-cylindrical body and a first cylinder disposed on one side of the semi-cylindrical body.

A radius of a cross-section of the semi-cylindrical body is not less than a radius of a cross-section of the bending space.

A diameter of the first cylinder is smaller than the radius of the cross-section of the bending space.

In one embodiment of the disclosure, the supporting structure further includes a second cylinder. The second cylinder is disposed on a side of the semi-cylindrical body away from the first cylinder, and a diameter of the second cylinder is smaller than the radius of the cross-section of the bending space.

In one embodiment of the disclosure, a height of the supporting structure is equal to a height of the bending space.

Furthermore, another embodiment of the disclosure provides a method of manufacturing a display device, including steps of:

providing a backplate, wherein the backplate includes a first backplate and a second backplate;

disposing a first non-bending area of a display panel on the first backplate, and disposing a second non-bending area of the display panel on the second backplate;

coating a thermosetting material on a side of a bending area of the display panel near the backplate;

bending the display panel toward the backplate to make the bending area of the display panel form a bending space and to make the first backplate attach the second backplate; and heating the thermosetting material to solidify the thermosetting material to support the bending area of the display panel.

In one embodiment of the disclosure, the thermosetting material includes thermosetting glue.

Furthermore, another embodiment of the disclosure provides a method of manufacturing a display device, including the steps of:

providing a backplate, wherein the backplate includes a first backplate and a second backplate;

disposing a first non-bending area of a display panel on the first backplate, and disposing a second non-bending area of the display panel on the second backplate;

bending the display panel toward the backplate to make the bending area of the display panel form a bending space and to make the first backplate attach the second backplate; and filling a supporting structure in the bending space to support the bending area of the display panel.

In one embodiment of the disclosure, the step that filling a supporting structure in the bending space to support the bending area of the display panel further includes steps of:

providing a supporting part, wherein the supporting part includes the supporting structure and an introducer disposed at an end of the supporting structure;

introducing the supporting structure into the bending space by the introducer; and separating the introducer from the supporting part.

In one embodiment of the disclosure, the introducer has a cylindrical shape, and a diameter of a cross-section of the introducer is less than a radius of a cross-section of the bending space.

In one embodiment of the disclosure, the bending space is semi-cylindrical, and the supporting structure has a semi-cylindrical shape matched with the bending space.

In one embodiment of the disclosure, a radius of a cross-section of the supporting structure is not less than a radius of a cross-section of the bending space.

In one embodiment of the disclosure, materials of the supporting structure include thermosetting glue, rubber or silicone.

In comparison with prior art, the display device and the method of manufacturing the same of the disclosure support the bending area of the display panel after bent by providing the supporting structure and improve the product yield.

DETAILED DESCRIPTION OF PREFERRED EMBODIMENTS

The following description of the embodiments is provided by reference to the following drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 1:
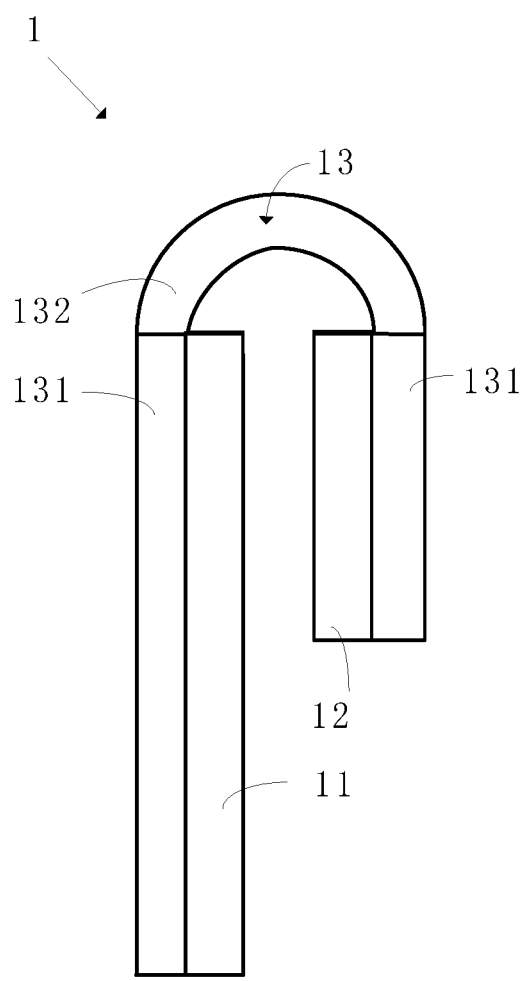
FIG. 1 is a schematic view of a structure of a display device according to prior art.
Figure 2:
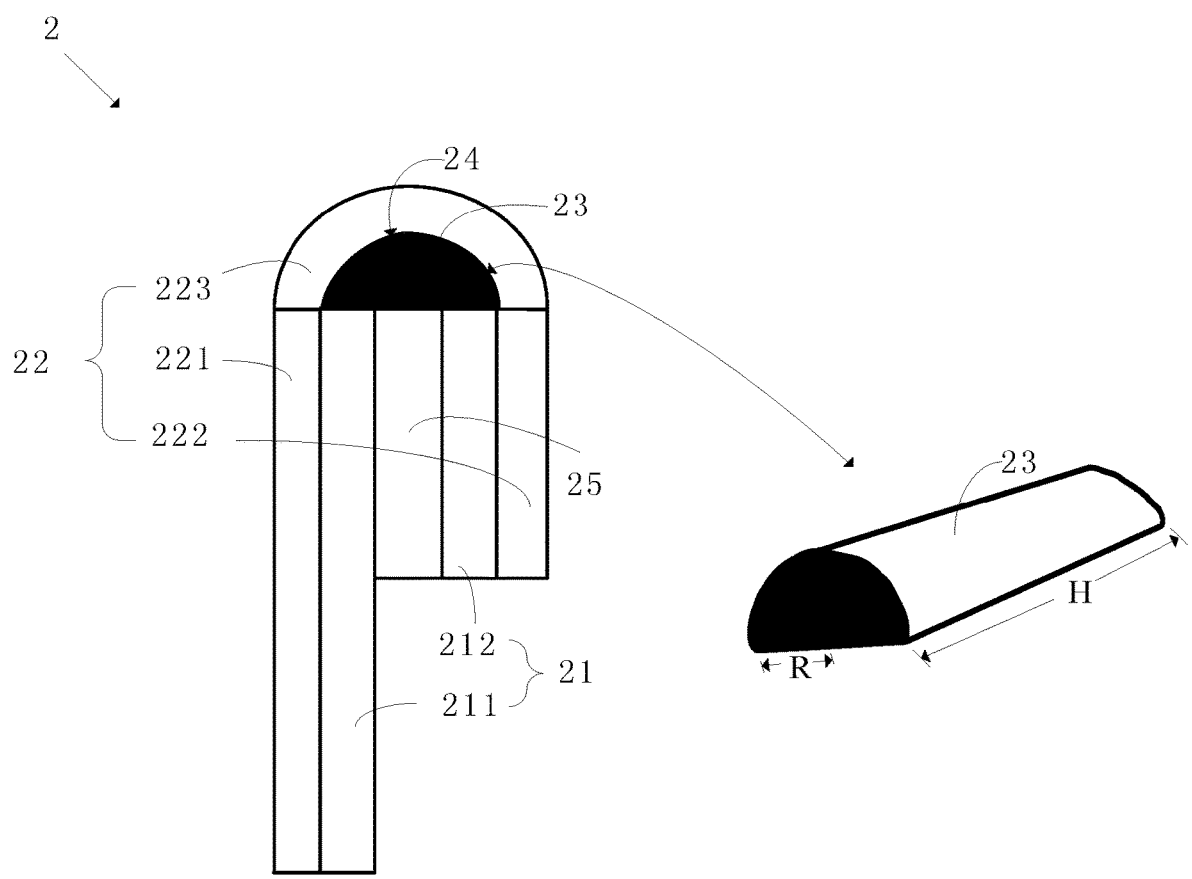
FIG. 2 is a schematic view of a structure of a display device according to an embodiment of the present disclosure.

Referring to FIG. 2, FIG. 2 is a schematic view of a structure of a display device according to an embodiment of the present disclosure. The display device 2 includes a backplate 21, a display panel 22, a supporting structure 23, and a bending space 24. The backplate 21 includes a first backplate 211 and a second backplate 212. The display panel 22 includes a first non-bending area 221, a second non-bending area 222, and a bending area 223 disposed between the first non-bending area 221 and the second non-bending area 222.

Figure 3:
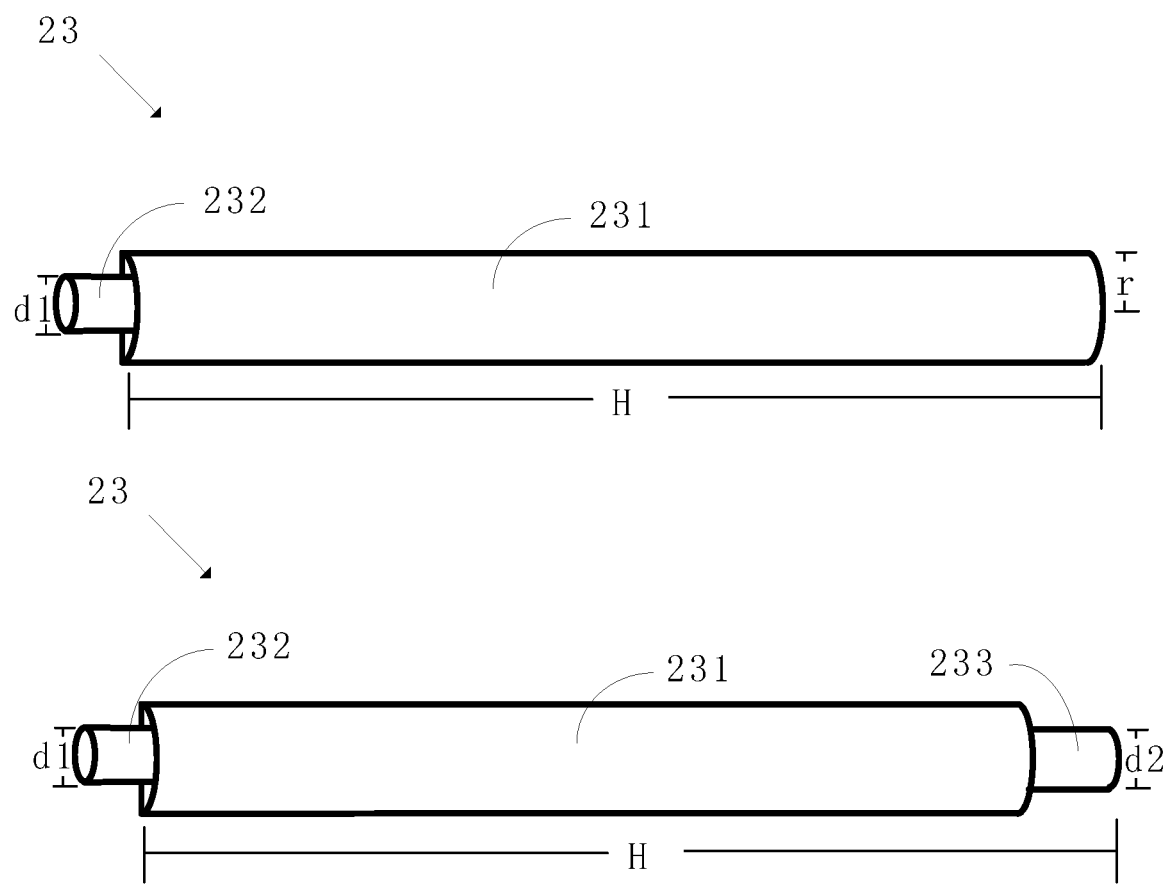
FIG. 3 is a schematic view of a structure of a supporting structure according to an embodiment of the present disclosure.

Referring to FIG. 3, the backplate 21 is configured to support the display panel 22 thereon. In detail, the first backplate 211 is configured to support the first non-bending area 221. The second backplate 212 is configured to support the second non-bending area 222.

The bending area 223 of the display panel 22 is bent toward the backplate 21 to form the bending space 24. The bending space 24 has a semi-cylindrical shape. In one embodiment of the disclosure, the bending area 223 is bent toward the backplate 21 to make the first backplate 211 to attach the second backplate 212 by providing a glue layer 25 between the first backplate 211 and the second backplate 212.

The supporting structure 23 is filled in the bending space 24 to support the bending area 223 of the display panel 22. The supporting structure 23 may be made of an elastic material. In one embodiment of the disclosure, materials of the supporting structure 23 include thermosetting glue, rubber or silicone.

Referring to FIG. 2, the supporting structure 23 has a semi-cylindrical shape matching the bending space 24. A radius of a cross-section of the supporting structure 23 is R. The radius R of a cross-section is not less than a radius of a cross-section of the bending space 24, that is, the radius R of a cross-section is not less than a bending radius of the bending space. In this way, the supporting structure 23 can fully support the bending area 223, and can effectively help the bending area 223 relieve stress when the bending area 223 is subject to external stress.

Referring to FIG. 3, the supporting structure 23 includes a body 231 and a first cylinder 232. The body 231 has a semi-cylindrical shape matching the bending space 24. The first cylinder 232 is disposed on one end of the body 231. A radius r of a cross-section of the body 231 is not less than a radius of a cross-section of the bending space 24. The body 231 can fully support the bending area 223, and can effectively help the bending area 223 relieve stress when the bending area 223 is subjected to external stress. A diameter d1 of the first cylinder 232 is smaller than the radius of the cross-section of the bending space 24 for facilitating insertion of the supporting structure 23 into the bending space 24. After the supporting structure 23 is completely inserted into the bending space 24, glue may be dropped on the side of the first cylinder 232 to fix the supporting structure 23.

In one embodiment of the disclosure, the supporting structure 23 further includes a second cylinder 233. The second cylinder 233 is disposed on a side of the body 231 away from the first cylinder 232. A diameter d2 of the second cylinder 233 is also smaller than the radius of the cross-section of the bending space 24. In this way, either ends of the supporting structure 23 is suitable for inserting into the bending space 24, so that one can quickly inserted the supporting structure 23 into the bending space 24. After the supporting structure 23 is completely inserted into the bending space 24, glue may be dropped on both sides of the first cylinder 232 and the second cylinder 233 to fix the supporting structure 23.

Referring to FIG. 2 or 3, in one embodiment of the disclosure, a height H of the supporting structure 23 is equal to a height of the bending space 24.

Figure 4:
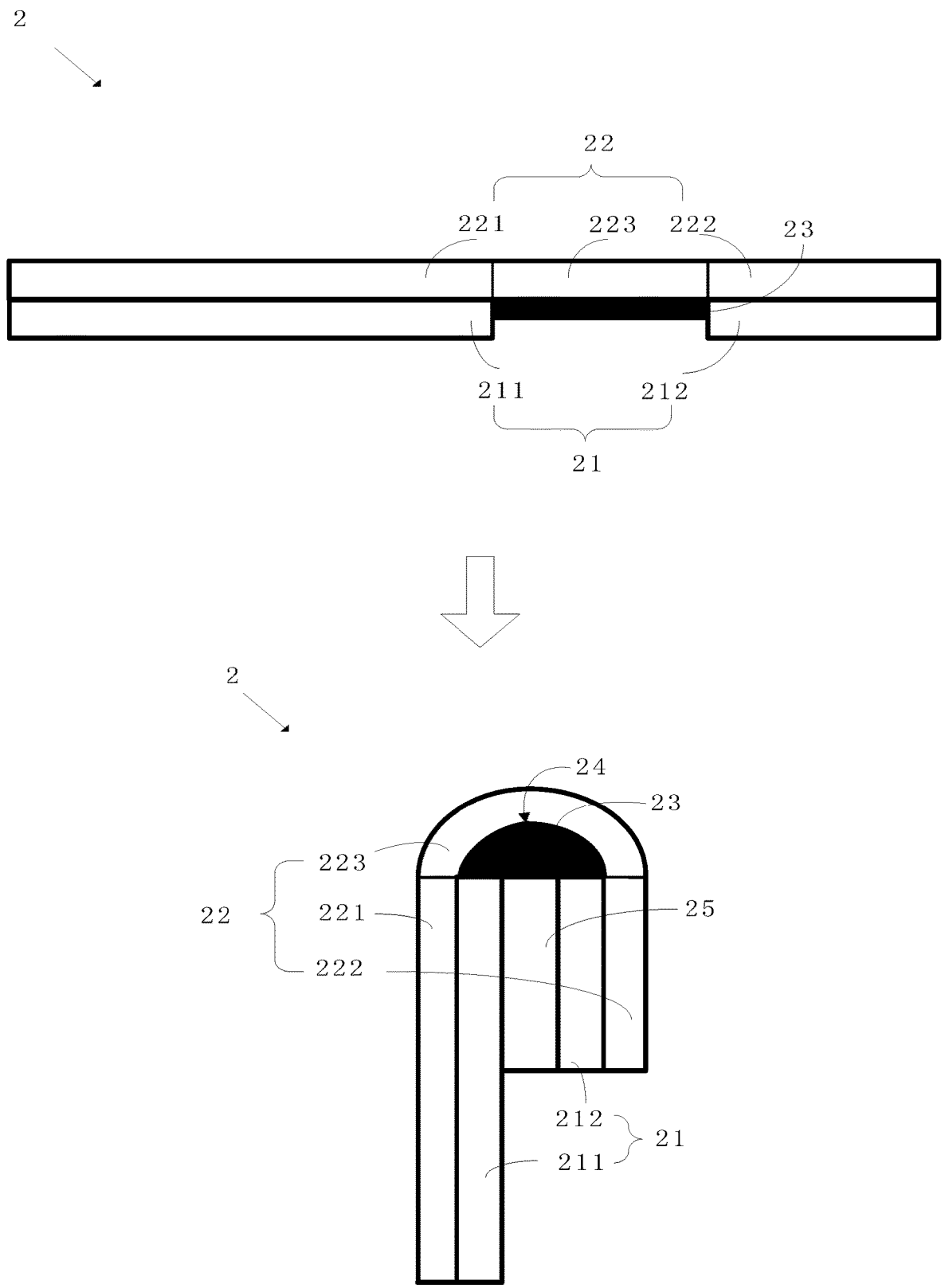
FIG. 4 is a schematic view of a first scenario of a method of manufacturing a display device according to an embodiment of the present disclosure.

Referring to FIG. 4, in an embodiment of the disclosure, the supporting structure 23 may be disposed in advance on the side of the bending area 223 near the backplate 21 before the bending area 223 of the display panel 22 is bent. The bending area 223 is then bent to form the bending space 24, and the supporting structure 23 in turn fills the bending space 24.

Preferably, one can coat a thermosetting material on a side of the bending area 223 near the backplate 21 at room temperature. The thermosetting material is in a gel state and does not affect the subsequent bending process of the bending area 223. Then one can bend the bending area 223 to form the bending space 24. Because the thermosetting material has fluidity at room temperature, the thermosetting material will be dispersed throughout the bending space 24. Then one can heat the thermosetting material at 80 to 100 degrees Celsius to solidify the thermosetting material to form the supporting structure 23. The thermosetting material includes thermosetting glue.

Figure 5:
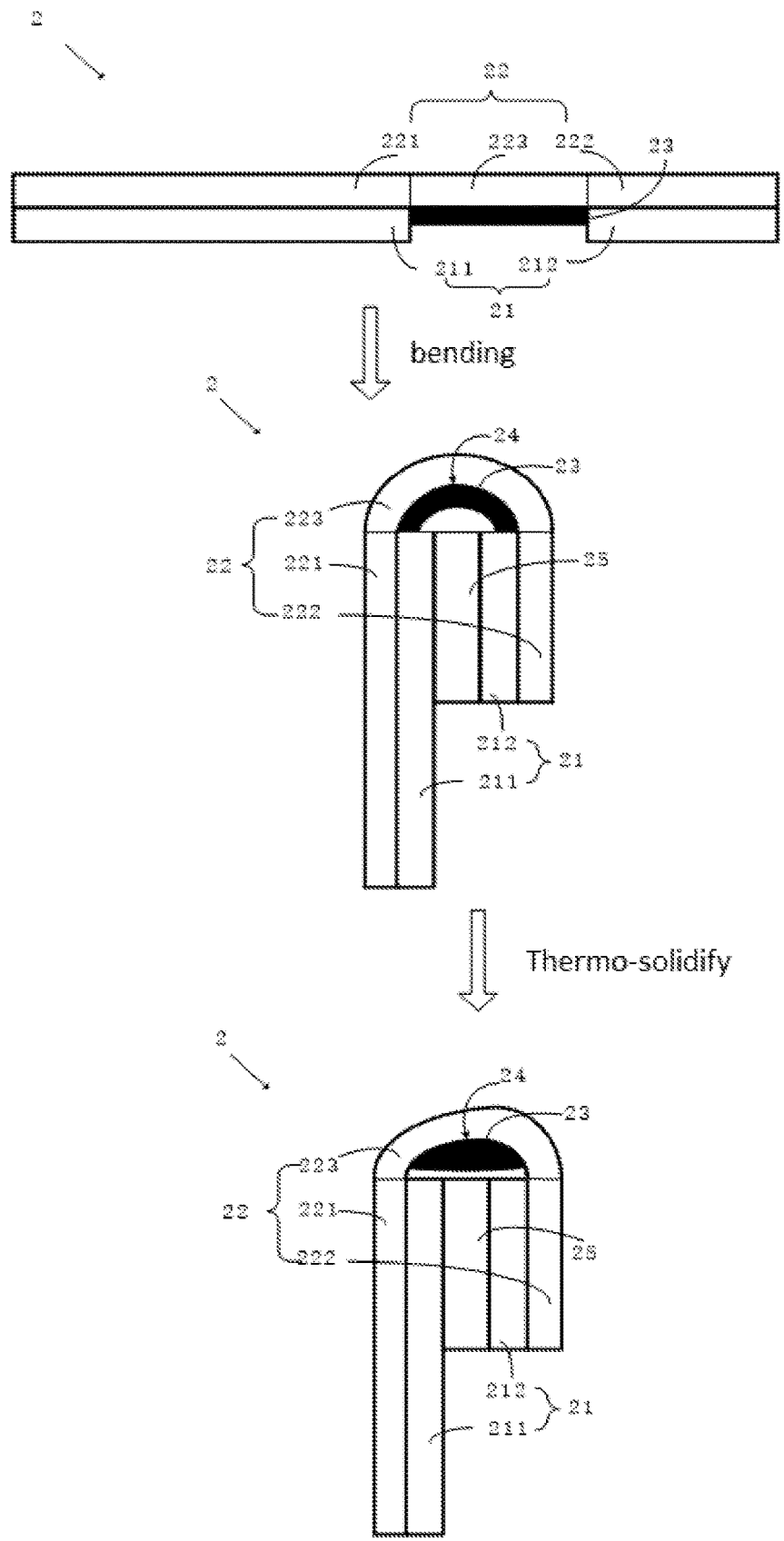
FIG. 5 is a schematic view of a second scenario of a method of manufacturing a display device according to an embodiment of the present disclosure.

Referring to FIG. 5, affected by the processing technology and the characteristics of the thermoset material, when a material of the supporting structure 23 is a thermosetting material such as thermosetting glue, the thermosetting material may form the supporting structure with an irregular curved surface after a thermo-solidify process. The supporting structure 23 is partially filled the bending space 24, so that the bending space 24 also has an irregular curved surface matched with the supporting structure 23.

Figure 6:
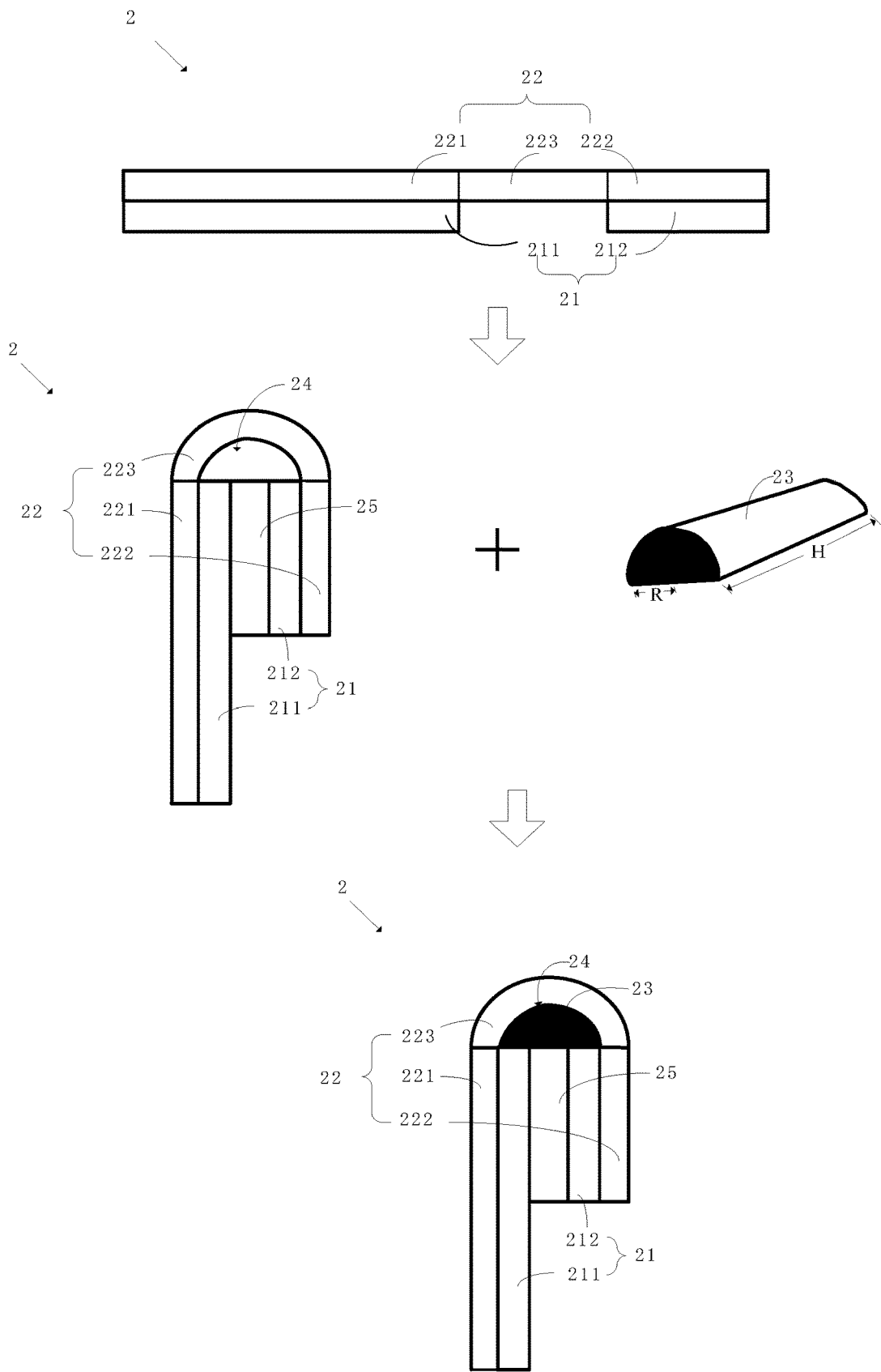
FIG. 6 is a schematic view of a third scenario of a method of manufacturing a display device according to an embodiment of the present disclosure.

Referring to FIG. 6, in an embodiment of the disclosure, one can fill the supporting structure 23 into the bending space 24 after the bending area 223 of the display panel 22 bent to form the bending space 24.

The display device in an embodiment of the disclosure supports the bending area of the display panel after bent by providing the supporting structure and improves the product yield.

Figure 7:
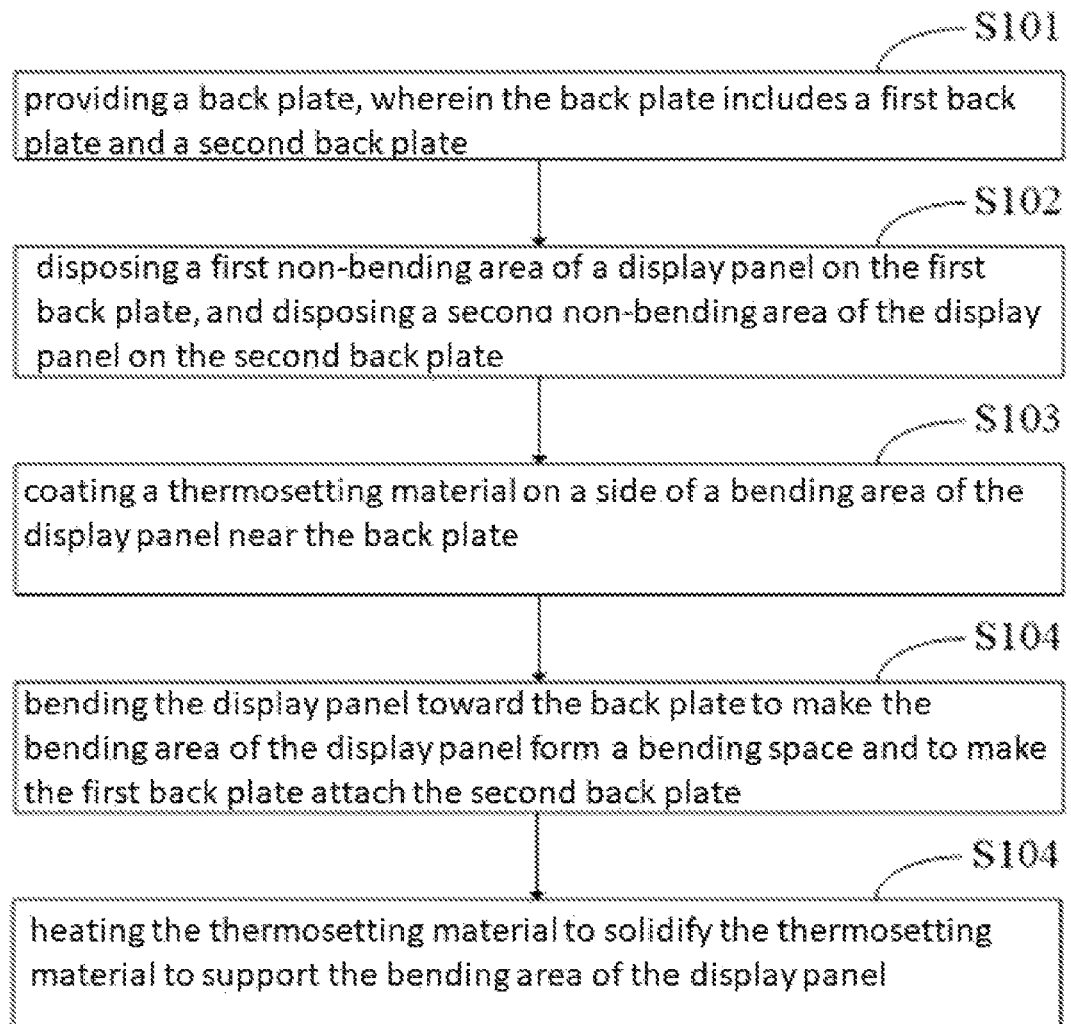
FIG. 7 is a schematic view of a first flow chart of a method of manufacturing a display device according to an embodiment of the present disclosure.

Referring to FIG. 7, furthermore, another embodiment of the disclosure provides a method of manufacturing a display device. FIG. 7 is a schematic view of a flow chart of a method of manufacturing a display device according to an embodiment of the disclosure. The method includes the following steps:

At step S101, providing a backplate, wherein the backplate includes a first backplate and a second backplate. The first backplate and the second backplate have a function of supporting parts disposed thereon.

At step S102, disposing a first non-bending area of a display panel on the first backplate, and disposing a second non-bending area of the display panel on the second backplate.

Referring to FIG. 4 or 5, disposing a first non-bending area 221 of a display panel 22 on the first backplate 211 means that the first backplate 211 is configured to support the first non-bending area 221. Disposing a second non-bending area 222 of a display panel 22 on the second backplate 212 means that the second backplate 212 is configured to support the second non-bending area 222.

At step S103, coating a thermosetting material on a side of a bending area of the display panel near the backplate.

The thermosetting material is in a gel state at room temperature and does not affect the subsequent bending process of the bending area 223. Then one can heat the thermosetting material at some temperature to solidify the thermosetting material to provide a supporting function. In one embodiment of the disclosure, the thermosetting material includes thermosetting glue.

At step S104, bending the display panel toward the backplate to make the bending area of the display panel to form a bending space and to make the first backplate to attach the second backplate.

After the bending area 223 of the display panel 22 is bent to form the bending space 24, the thermosetting material will be dispersed throughout the bending space 24 because the thermosetting material has fluidity at room temperature.

In one embodiment of the disclosure, a glue layer 25 may be provided between the first backplate 211 and the second backplate 212 to attach the first backplate 211 and the second backplate 212 together.

At step S105, heating the thermosetting material to solidify the thermosetting material to support the bending area of the display panel.

One can heat the thermosetting material at 80 to 100 degrees Celsius to solidify the thermosetting material to form the supporting structure 23. The display device 2 will not be damaged at the aforementioned temperature range.

Referring to FIG. 5, affected by the processing technology and the characteristics of the thermoset material, the thermosetting material may form the supporting structure 23 with an irregular curved surface after the thermo-solidify process. The supporting structure 23 is partially filled the bending space 24, so that the bending space 24 also has an irregular curved surface matched with the supporting structure 23.

The method of manufacturing a display device in an embodiment of the disclosure improving the product yield by coating a thermosetting material on a side of a bending area near the backplate before the display device is bent and heating the thermosetting material to form a supporting structure.

Figure 8:
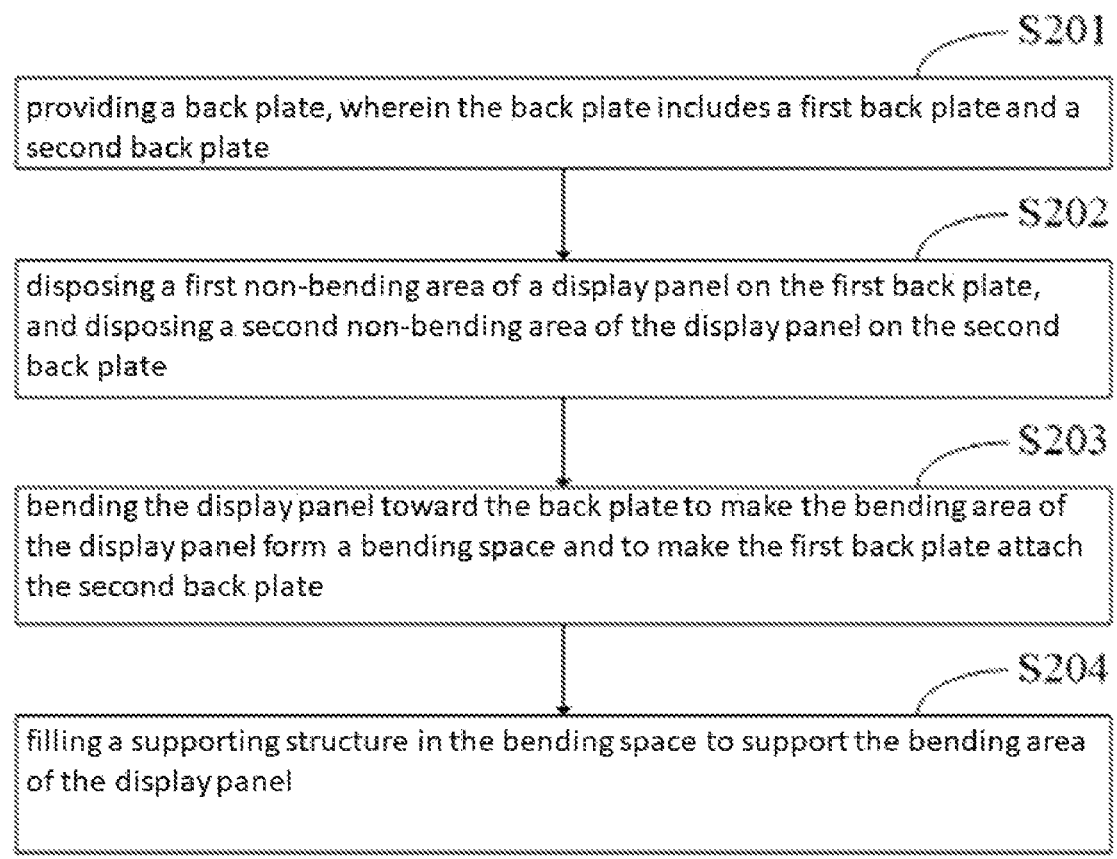
FIG. 8 is a schematic view of a second flow chart of a method of manufacturing a display device according to an embodiment of the present disclosure.

Referring to FIG. 8, furthermore, another embodiment of the disclosure provides a method of manufacturing a display device. FIG. 8 is a schematic view of a flow chart of a method of manufacturing a display device according to an embodiment of the disclosure. The method includes the following steps:

At step S201, providing a backplate, wherein the backplate includes a first backplate and a second backplate. The first backplate and the second backplate have a function of supporting to parts disposed thereon.

At step S202, disposing a first non-bending area of a display panel on the first backplate, and disposing a second non-bending area of the display panel on the second backplate.

Referring to FIG. 4 or 5, disposing a first non-bending area 221 of a display panel 22 on the first backplate 211 means that the first backplate 211 is configured to support the first non-bending area 221. Disposing a second non-bending area 222 of a display panel 22 on the second backplate 212 means that the second backplate 212 is configured to support the second non-bending area 222.

At step S203, bending the display panel toward the backplate to make the bending area of the display panel to form a bending space and to make the first backplate to attach the second backplate.

After the bending area 223 of the display panel 22 is bent to form the bending space 24, the first backplate 211 and the second backplate 212 are disposed opposite to each other. A glue layer 25 may be provide between the first backplate 211 and the second backplate 212 to attach the first backplate 211 and the second backplate 212 together.

At step S204, filling a supporting structure in the bending space to support the bending area of the display panel.

Referring to FIG. 3, the supporting structure 23 includes a body 231 and a first cylinder 232. The body 231 has a semi-cylindrical shape matching the bending space 24. The first cylinder 232 is disposed on one end of the body 231. A radius r of a cross-section of the body 231 is not less than a radius of a cross-section of the bending space 24. The body 231 can fully support the bending area 223, and can effectively help the bending area 223 relieve stress when the bending area 223 is subjected to external stress. A diameter d1 of the first cylinder 232 is smaller than the radius of the cross-section of the bending space 24 for facilitating insertion of the supporting structure 23 into the bending space 24. After the supporting structure 23 is completely inserted into the bending space 24, glue may be dropped on the side of the first cylinder 232 to fix the supporting structure 23.

In one embodiment of the disclosure, the supporting structure 23 further includes a second cylinder 233. The second cylinder 233 is disposed on a side of the body 231 away from the first cylinder 232. A diameter d2 of the second cylinder 233 is also smaller than the radius of the cross-section of the bending space 24. In this way, either ends of the supporting structure 23 is suitable for inserting into the bending space 24, so that one can quickly inserted the supporting structure 23 into the bending space 24. After the supporting structure 23 is completely inserted into the bending space 24, glue may be dropped on both sides of the first cylinder 232 and the second cylinder 233 to fix the supporting structure 23.

Referring to FIG. 2 or 3, in one embodiment of the disclosure, a height H of the supporting structure 23 is equal to a height of the bending space 24.

In one embodiment of the disclosure, one can fill a supporting structure in the bending space to support the bending area of the display panel by the following steps:

At step S1, providing a supporting part, wherein the supporting part includes the supporting structure and an introducer disposed at an end of the supporting structure;

At step S2, introducing the supporting structure into the bending space by the introducer; and At step S3, separating the introducer from the supporting part to keep the supporting structure filled in the bending space.

Figure 9:
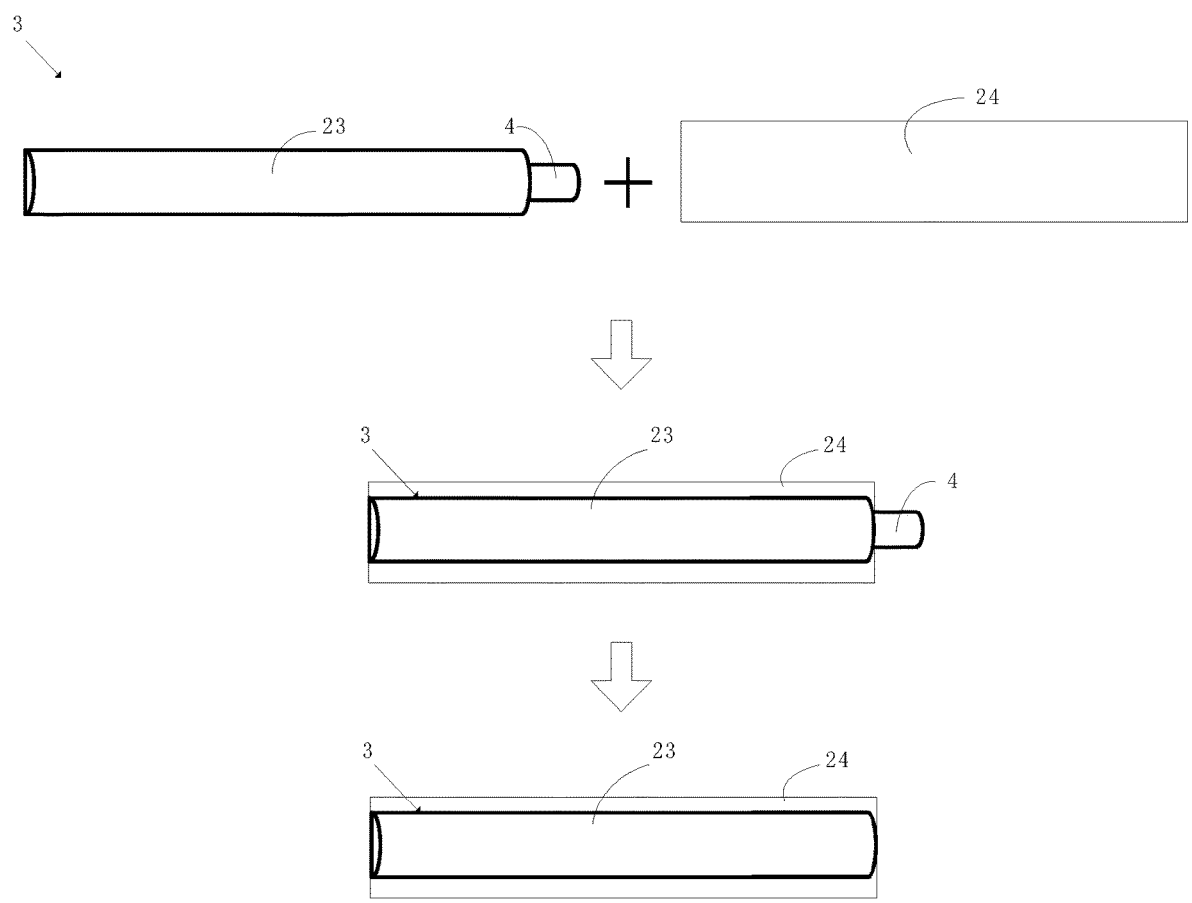
FIG. 9 is a schematic view of a fourth scenario of a method of manufacturing a display device according to an embodiment of the present disclosure.

Referring to FIG. 9, a supporting part 3 may also be provided. The supporting part 3 includes a supporting structure 23, and an introducer 4 disposed at one end of the supporting structure 23. The introducer 4 may be provided in a cylindrical shape having a section diameter smaller than a section radius of the bending space 24 to facilitate insertion into the bending space 24.

Referring to FIG. 2, the supporting structure 23 has a semi-cylindrical shape matching the bending space 24. A radius of a cross-section of the supporting structure 23 is R. The radius R of a cross-section is not less than a radius of a cross-section of the bending space 24, that is the radius R of a cross-section is not less than a bending radius of the bending space. In this way, the supporting structure 23 can fully support the bending area 223, and can effectively help the bending area 223 relieve stress when the bending area 223 is subjected to external stress.

After the introducer 4 is inserted into the bending space 24, the supporting structure 23 can be pushed into the curved space 24. Until the supporting structure 23 is completely immersed in the bending space 24, the introducer 4 is peeled off leaving only the supporting structure 23.

The method of manufacturing the same of the disclosure improves the product yield by providing the supporting structure with a shape matching the bending space to fill the bending space and support the bending area.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A display device, comprising:
   a back plate;
   a display panel; and
   a supporting structure, wherein:
   the back plate comprises a first back plate and a second back plate;
   the display panel comprises a first non-bending area, a second non-bending area, and a bending area disposed between the first non-bending area and the second non-bending area;
   the first back plate is configured to support the first non-bending area;
   the second back plate is configured to support the second non-bending area;
   the bending area is bent toward the back plate to form a bending space, and to make the first back plate attach the second back plate; and
   the supporting structure is filled in the bending space to support the bending area of the display panel,
   wherein a surface of the supporting structure is an irregular curved surface, when material of the support structure is a thermosetting glue, and the supporting structure is partially filled the bending space, so that the bending space comprises an irregular curved surface matched with the supporting structure.

2. The display device according to claim 1, wherein materials of the supporting structure comprise thermosetting glue, rubber or silicone.

3. A method of manufacturing a display device, comprising the steps of:
   providing a back plate, wherein the back plate comprises a first back plate and a second back plate;
   disposing a first non-bending area of a display panel on the first back plate, and disposing a second non-bending area of the display panel on the second back plate;
   bending the display panel toward the back plate to make the bending area of the display panel form a bending space and to make the first back plate attach the second back plate; and
   filling a supporting structure in the bending space to support the bending area of the display panel,
   wherein the step that filling a supporting structure in the bending space to support the bending area of the display panel further comprises steps of:
   providing a supporting part, wherein the supporting part comprises the supporting structure and an introducer disposed at an end of the supporting structure;
   introducing the supporting structure into the bending space by the introducer; and
   separating the introducer from the supporting part to keep the supporting structure filled in the bending space.

4. The method of manufacturing the display device according to claim 3, wherein the introducer has a cylindrical shape, and a diameter of a cross-section of the introducer is less than a radius of a cross-section of the bending space.

5. The method of manufacturing the display device according to claim 3, wherein the bending space is semi-cylindrical, and the supporting structure has a semi-cylindrical shape matched with the bending space.

6. The method of manufacturing the display device according to claim 5, wherein a radius of a cross-section of the supporting structure is not less than a radius of a cross-section of the bending space.

7. The method of manufacturing the display device according to claim 3, wherein materials of the supporting structure comprise thermosetting glue, rubber or silicone.

8. A display device, comprising:
   a back plate;
   a display panel; and a supporting structure, wherein:
the back plate comprises a first back plate and a second back plate;
the display panel comprises a first non-bending area, a second non-bending area, and a bending area disposed between the first non-bending area and the second non-bending area;
the first back plate is configured to support the first non-bending area;
the second back plate is configured to support the second non-bending area;
the bending area is bent toward the back plate to form a bending space, and to make the first back plate attach the second back plate; and
the supporting structure is filled in the bending space to support the bending area of the display panel,
wherein the bending space has a semi-cylindrical shape, the supporting structure comprises a semi-cylindrical body, a first cylinder, and a second cylinder; the is first cylinder disposed on one side of the semi-cylindrical body, a radius of a cross-section of the semi-cylindrical body is not less than a radius of a cross-section of the bending space, and a diameter of the first cylinder is smaller than the radius of the cross-section of the bending space, and the second cylinder is disposed on a side of the body away from the first cylinder, and a diameter of the second cylinder is smaller than the radius of the cross-section of the bending space.

9. The display device according to claim 8, wherein a height of the supporting structure is equal to a height of the bending space.

10. The display device according to claim 8, wherein the bending space has a semi-cylindrical shape, and the supporting structure has a semi-cylindrical shape matching the bending space.

11. The display device according to claim 10, wherein a radius of a cross-section of the supporting structure is not less than a radius of a cross-section of the bending space.

\* \* \* \* \*